(12) United States Patent
Okamoto et al.

(10) Patent No.: US 9,439,317 B2
(45) Date of Patent: Sep. 6, 2016

(54) WIRING MODULE

(75) Inventors: Ryoya Okamoto, Yokkaichi (JP);
Hiroomi Hiramitsu, Yokkaichi (JP);
Hiroki Hirai, Yokkaichi (JP);
Masakuni Kasugai, Osaka (JP)

(73) Assignees: AutoNetworks Technologies, Ltd.,
Yokkaichi, Mie (JP); **SUMITOMO
ELECTRIC INDUSTRIES, LTD.**,
Osaka-shi, Osaka (JP); **Sumitomo
Wiring Systems, Ltd.**, Yokkaichi, Mie
(JP)

( * ) Notice: Subject to any disclaimer, the term of this patent is extended or adjusted under 35 U.S.C. 154(b) by 275 days.

(21) Appl. No.: 14/007,764

(22) PCT Filed: Apr. 10, 2012

(86) PCT No.: PCT/JP2012/059759
§ 371 (c)(1),
(2), (4) Date: Sep. 26, 2013

(87) PCT Pub. No.: WO2012/141164
PCT Pub. Date: Oct. 18, 2012

(65) Prior Publication Data
US 2014/0016294 A1 Jan. 16, 2014

(30) Foreign Application Priority Data
Apr. 11, 2011 (JP) .................. 2011-087600

(51) Int. Cl.
*H05K 7/06* (2006.01)
*H01R 13/518* (2006.01)
(Continued)

(52) U.S. Cl.
CPC .............. *H05K 7/06* (2013.01); *H01R 13/518*
(2013.01); *H05K 7/1435* (2013.01);
(Continued)

(58) Field of Classification Search
CPC .... H05K 7/06; H05K 7/1477; H05K 7/1435;
H05K 7/1439; H01R 13/518; H01R 13/631;
H01R 13/642; H01R 9/2416
USPC .................. 361/826–828; 439/627, 500, 90;
174/72 A, 72 TR, 152 R
See application file for complete search history.

(56) References Cited

U.S. PATENT DOCUMENTS 3,861,015 A * 1/1975 Hooven .......................... 29/755
5,731,546 A * 3/1998 Miles et al. .................. 174/135
(Continued)

FOREIGN PATENT DOCUMENTS

EP 0249750 12/1987
EP 1280363 1/2003
(Continued)

OTHER PUBLICATIONS

European Search Report.
(Continued)

*Primary Examiner* — Adrian S Wilson
*Assistant Examiner* — Abhishek Rathod
(74) *Attorney, Agent, or Firm* — Gerald E. Hespos; Michael J. Porco; Matthew T. Hespos

(57) ABSTRACT

A wiring module (1) includes a wiring harness (10) including a plurality of wires (11) and connectors (12) fixed to ends of the respective wires (11) and fittable into fitting portions (91) of a stacked device (90). A positioning member (20) is fixed to the wiring harness (10) and capable of being positioned at a predetermined position with respect to the stacked device (90). The positioning member (20) includes connector fixing portions (21) arranged at the same intervals as the fitting portions (91) of the stacked device (90). The connector fixing portion (21) positions each connector (12) of the wiring harness (10) fixedly at a position facing the corresponding fitting portion (91) when the positioning member (20) is positioned at the predetermined position with respect to the stacked device (90).

7 Claims, 4 Drawing Sheets

(51) Int. Cl.
    *H05K 7/14*     (2006.01)
    *H01R 9/24*     (2006.01)
    *H01R 13/631*     (2006.01)
    *H01R 13/642*     (2006.01)

(52) U.S. Cl.
    CPC ......... *H05K 7/1439* (2013.01); *H05K 7/1477* (2013.01); *H01R 9/2416* (2013.01); *H01R 13/631* (2013.01); *H01R 13/642* (2013.01)

(56) References Cited

U.S. PATENT DOCUMENTS

| | | | |
|---|---|---|---|
| 5,795,174 A | 8/1998 | Saito et al. | |
| 6,359,789 B1* | 3/2002 | Imabayashi | G02B 6/3897 361/730 |
| 6,848,854 B2* | 2/2005 | Masse | 403/329 |
| 7,637,773 B2* | 12/2009 | Shifris et al. | 439/540.1 |
| 2002/0102457 A1 | 8/2002 | Oogami et al. | |
| 2008/0130261 A1* | 6/2008 | Dennes | 361/826 |
| 2009/0034227 A1* | 2/2009 | Mayer | 361/826 |
| 2010/0142176 A1* | 6/2010 | Caveney | 361/826 |
| 2011/0064987 A1 | 3/2011 | Ogasawara et al. | |
| 2012/0328920 A1* | 12/2012 | Takase et al. | 429/90 |

FOREIGN PATENT DOCUMENTS

| | | |
|---|---|---|
| JP | 8-273753 | 10/1996 |
| JP | 10-241773 | 9/1998 |
| JP | 2004-146117 | 5/2004 |
| JP | 2005-151677 | 6/2005 |
| JP | 2010225449 | 10/2010 |

OTHER PUBLICATIONS

International Search Report of May 29, 2012.

* cited by examiner

WIRING MODULE

BACKGROUND

1. Field of the Invention

This invention relates to a wiring model for wiring a stacked device formed by stacking a plurality of units.

2. Description of the Related Art

Japanese Unexamined Patent Publication No. 2005-151677 discloses a power supply device in which a plurality of power supply units are stacked (arranged). Without being limited to such a power supply device, there are many devices formed by stacking identically or similarly configured units (hereinafter, such devices are called stacked devices).

In electrically connecting a stacked device to another device, a wiring harness including a plurality of wires corresponding to the number of units constituting the stacked device is used in many cases. Connectors are provided on ends of the respective wires of the wiring harness. Predetermined corresponding connectors have to be connected to connector fitting portions of the respective units constituting the stacked device.

However, such as in the case of a stacked device formed by stacking identical units, a connector other than a corresponding one may be fitted to a certain unit constituting the stacked device (a possibility of the occurrence of a failure due to so-called erroneous connection) if the connector fitting portions provided on the respective units are identically shaped.

In view of the above situation, a problem sought to be solved by the present invention is overcome by providing a wiring module which can reliably and easily wires a stacked device formed by stacking a plurality of units each including an identically shaped fitting portion for a connector.

SUMMARY OF THE INVENTION

To solve the above problem, one aspect of the present invention is directed to a wiring module to be mounted on a stacked device formed by stacking a plurality of units each including an identically shaped fitting portion for a connector, including a wiring harness including a plurality of wires and connectors fixed to ends of the respective wires and fittable into the fitting portions; and a positioning member fixed to the wiring harness and capable of being positioned at a predetermined position with respect to the stacked device; wherein the positioning member includes connector fixing portions arranged at the same intervals as the fitting portions of the stacked device; and each connector of the wiring harness is fixedly positioned at a position facing the corresponding fitting portion out of a plurality of fitting portions by the connector fixing portion in a state where the positioning member is positioned at the predetermined position with respect to the stacked device.

To solve the above problem, another aspect of the present invention is directed to a wiring module to be mounted on a stacked device formed by stacking a plurality of units each including an identically shaped fitting portion for a connector, including a wiring harness including a plurality of wires and connectors fixed to ends of the respective wires and fittable into the fitting portions; and a positioning member fixed to the wiring harness and capable of being positioned at a predetermined position with respect to the stacked device; wherein the wiring harness is so fixed to the positioning member that parts of the respective wires having predetermined lengths from the connectors are freely guidable; and the length of the freely guidable part of each wire is so set that the connector is not fittable into the fitting portions other than the corresponding one out of a plurality of fitting portions in a state where the positioning member is positioned at the predetermined position with respect to the stacked device.

In the above present invention, the wires of the wiring harness may be accommodated in a channel-like wire accommodating passage formed on the positioning member.

Further, in the above present invention, the wires of the wiring harness accommodated in the wire accommodating passage may be bundled by a bundling member inserted through a bundling member insertion hole formed on an outer wall of the wire accommodating passage.

Further, in the above present invention, the positioning member may include positioning portions corresponding to two or more positioned portions provided on each unit constituting the stacked device.

In the case of using the wiring module according to one aspect of the present invention, the connectors of the wiring harness fixed to the positioning member face the corresponding fitting portions when the positioning member is positioned at the predetermined position with respect to the stacked device. That is, since the respective connectors are automatically fitted into the corresponding fitting portions only by positioning the positioning member at the predetermined position with respect to the stacked device, the stacked device can be reliably and easily wired.

On the other hand, in the case of using the wiring module according to another aspect of the present invention, the lengths of the freely guidable parts of the respective wires of the wiring harness from the connectors of the wiring harness fixed to the positioning member are such lengths that the respective connectors cannot be fitted into the fitting portions other than the corresponding ones when the positioning member is positioned at the predetermined position with respect to the stacked device. That is, since wiring is completed by fitting the respective connectors into the fittable fitting portions if the positioning member is positioned at the predetermined position with respect to the stacked device, the stacked device can be easily wired. Further, since the respective connectors cannot be fitted into the fitting portions other than the corresponding ones, the stacked device can be reliably wired.

Further, if the wires of the wiring harness are accommodated into the channel-like wire accommodating passage formed on the positioning member, the positioning member fulfills not only a function of reliably and easily wiring the stacked device, but also a wire protecting function.

Further, if the above wire accommodating passage is formed on the positioning member, the wires of the wiring harness accommodated in the wire accommodating passage can be easily bundled by the bundling member by forming the bundling member insertion hole on the outer wall of the wire accommodating passage.

Further, if the positioning member includes the positioning portions to be engaged with two or more positioned portions provided on each unit constituting the stacked device, the positioning member is positioned with respect to each unit. If the positioning member is mounted based on two or more positioned portions extending over a plurality of units, the mounted position of the positioning member may be displaced due to a stacking error (assembling error) of the respective units in the stacked device. However, since the positioning member is positioned with respect to each unit by the two or more positioned portions provided on each unit (the positioning member is positioned on the stacked device without being affected by a stacking error or the like of the units in the stacked device) according to this configuration, the wiring harness (connectors) is unlikely to be displaced from the fitting portions.

DETAILED DESCRIPTION OF THE PREFERRED EMBODIMENTS

Figure 1:
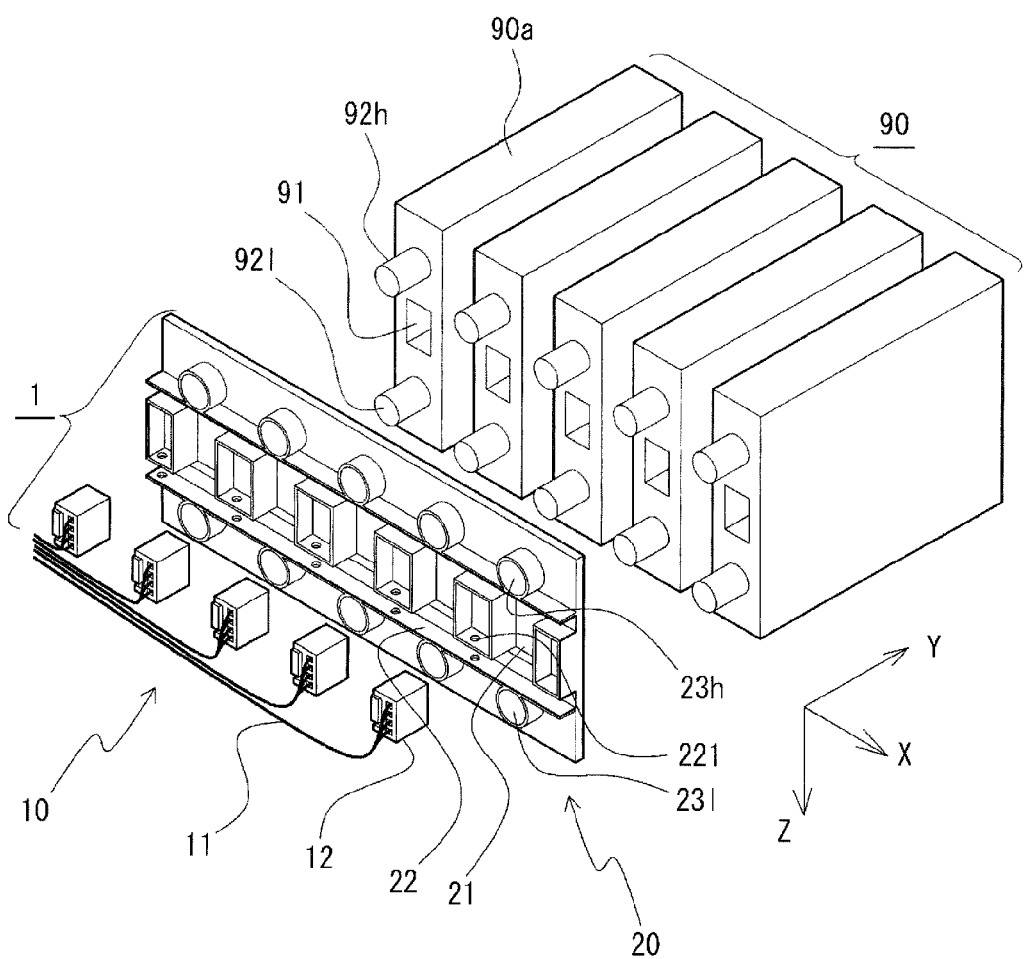
FIG. 1 is an exploded perspective view of a wiring module according to a first embodiment of the present invention showing also a stacked device for which this wiring module is to be used.

A wiring module 1 according to an embodiment of the present invention is described in detail with reference to the drawings. Note that, in the following description, unless otherwise particularly noted, a stacking direction means a direction in which units 90a constituting a stacked device 90 are stacked (X direction shown in FIGS. 1 to 3), forward and backward directions mean directions along which a side of the unit 90a constituting the stacked device 90 where a fitting portion 91 is provided is a front side and an opposite side thereof is a rear side (Y directions shown in FIGS. 1 to 3), and a height (vertical) direction means a direction perpendicular to the stacking direction and forward and backward directions (Z direction shown in FIGS. 1 to 3).

First, the stacked device 90 for which the wiring module 1 according to the embodiment of the present invention is preferably used is briefly described. The stacked device 90 is a device formed by stacking a plurality of identical units 90a in the X direction. The respective units 90a are stacked at equal intervals, for example, via unillustrated spacers or the like. The fitting portions 91 for connectors 12 are provided substantially at central positions of the respective units 90a in the height direction. Such fitting portions 91 are identically shaped. Further, since the identical units 90a are stacked at equal intervals in the X direction, the intervals between the respective fitting portions 91 in the X direction are equal. Further, positioning projections 92h, 92l (corresponding positioned portions in the present invention) in the form of cylindrical columns are provided at opposite sides of the fitting portion 91 in the height direction on each unit 90a. Specifically, two positioning projections 92h, 92l are provided on each unit 90a. In this embodiment, a distance between the fitting portion 91 and the upper positioning projection 92h is equal to that between the fitting portion 91 and lower positioning projection 92l.

The wiring module 1 according to the first embodiment is described. The wiring module 1 includes a wiring harness 10 and a positioning member 20.

The wiring harness 10 includes a plurality of wires 11 (formed by covering one or more strands with a coating material) and the connectors 12 mounted on ends of the respective wires 11. Note that the plurality of wires 11 may be bundled by another member in advance or may be loose as shown in each figure. Such connectors 12 have a substantially rectangular parallelepipedic outer shape and detachably fittable into the fitting portions 91 provided on the respective units 90a of the stacked device 90. Specifically, the connectors 12 provided in the wiring harness 10 are all identically shaped. The wiring harness 10 includes as many wires 11 as the units 90a of the stacked device 90. As described later, the lengths of the respective wires 11 are set at such lengths that the respective connectors 12 can be fixed to corresponding connector fixing portions 21 on the positioning member 20.

The positioning member 20 is a member for fixing the wiring harness 10 (connectors 12) at a predetermined position. The positioning member 20 is formed with the connector fixing portions 21, wire accommodating passages 22, positioning holes 23h, 23l (corresponding to positioning portions in the present invention).

The connector fixing portions 21 are holes having a substantially rectangular cross-section and enclosed by outer walls extending in the stacking direction and standing in forward and backward directions, and formed substantially at central positions of the positioning member 20 in the height direction. As many connector fixing portions 21 as the fitting portions 91 (units 90a) provided on the stacked device 90 are provided, and intervals between the respective connector fixing portions 21 in the X direction are equal. Such intervals are equal to those between the fitting portions 91 provided on the respective units 90a of the stacked device 90. That is, the connector fixing portions 21 are provided in a one-to-one relationship with the respective fitting portions 91 of the stacked device 90. The connectors 12 fixed to the ends of the wires 11 of the wiring harness 10 are fixed to such connector fixing portions 21. Specifically, the connectors 12 are press-fitted between the outer walls standing in forward and backward directions.

Here, each connector 12 is fixed to the corresponding connector fixing portion 21. As described above, the positioning member 20 is provided with the connector fixing portions 21 corresponding to the respective fitting portions 91 of the stacked device 90 and the respective connectors 12 are fixed to the connector fixing portions 21 corresponding to the fitting portions 91 into which the connectors 12 are supposed to be fitted. For example, if a certain wire 11 constituting the wiring harness 10 is supposed to be connected to the unit 90a located on the leftmost side in FIGS. 1 and 2, the connector 12 mounted on the end of this wire 11 is fixed to the connector fixing portion 21 located on the leftmost side in FIGS. 1 and 2. Since each connector 12 is fixed to the corresponding connector fixing portion 21 in this way, each wire 11 constituting the wiring harness 10 is set to have a length sufficient to fix the connector 12 to the corresponding to connector fixing portion 21.

The wire accommodating passage 22 is a channel-like passage extending in the stacking direction. In this embodiment, two wire accommodating passages 22 are provided at opposite sides of the connector fixing portions 21 in the vertical direction. The wires 11 of the wiring harness 10 are accommodated in at least one of the wire accommodating passages 22. In the case of using two or more wiring harnesses 10, the both wire accommodating passages 22 may be used.

Figure 2:
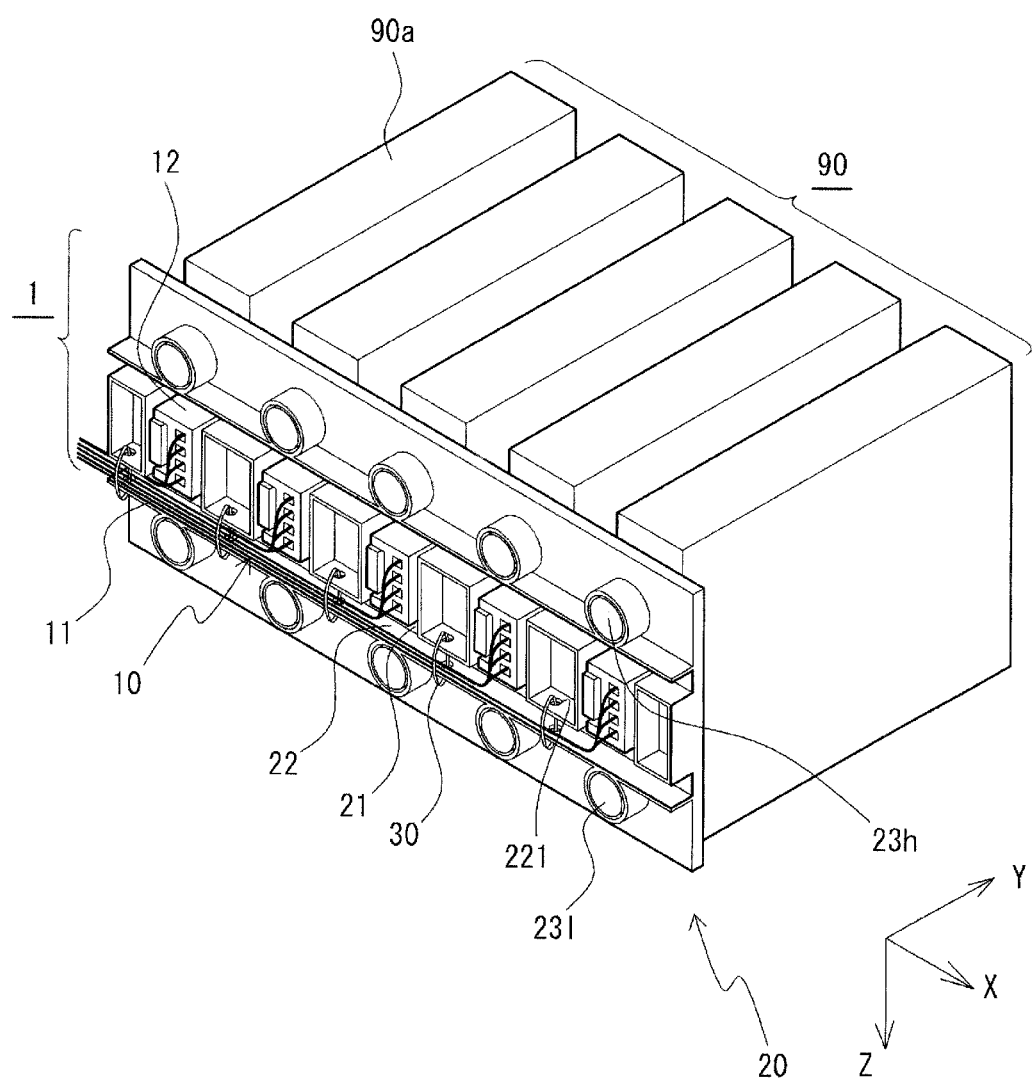
FIG. 2 is an external perspective view showing a state where the wiring module according to the first embodiment of the present invention is mounted on the stacked device.

The outer walls of the wire accommodating passage 22 are formed with bundling member insertion holes 221. In this embodiment, a pair of bundling member insertion holes 221 arranged side by side in forward and backward directions are formed on the outer walls on outer sides forming one wire accommodating passage 22. A plurality of pairs of bundling member insertion holes 221 are formed along the stacking direction. As shown in FIG. 2, the wires 11 accommodated in the wire accommodating passage 22 are bundled by each bundling member 30 inserted through one pair of bundling member insertion holes 221. That is, the wires 11 are accommodated in the wire accommodating passage 22 in a state fixed to the outer walls of the wire accommodating passage 22 by the bundling members 30.

The positioning holes 23h, 23l are circular through holes formed at outer sides of the wire accommodating passage 22 in the vertical direction. A distance between the connector fixing portions 21 located substantially in the vertical center and the upper positioning holes 23h is equal to that between the connector fixing portions 21 and the lower positioning holes 23l. Further, that distance is equal to the distances from the fitting portions 91 on the stacked device 90 to the upper and lower positioning projections 92h, 92l. As many upper positioning holes 23h and lower positioning holes 23l as the units 90a of the stacked device are respectively formed side by side in the stacking direction, and the intervals between the respective positioning holes 23h, 23l in the stacking direction are equal to those between the respective positioning projections 92h, 92l. Further, the hole diameter of the positioning holes 92h, 92l is slightly larger than the shaft diameter of the positioning projections 92h, 92l of the stacked device 90 (formed with a tolerance, in a so-called clearance-fit relationship). The wiring module 1 is positioned at a predetermined position by inserting the positioning projections 92h, 92l of the stacked device 90 into these positioning holes 23h, 23l. When this positioned state is reached, the respective connectors 12 fixed to the connector fixing portions 21 face the corresponding fitting portions 91 provided on the respective units 90a of the stacked device 90.

How to use the wiring module 1 having the above configuration is described. First, the wiring harness 10 is mounted on the positioning member 20 as described above to obtain the wiring module 1. Specifically, the respective connectors 12 are fixed to the corresponding connector fixing portions 21 of the positioning member 20 and the wires 11 are accommodated into the wire accommodating passage 22 of the positioning member 20 (the wires 11 are bundled by the bundling members 30 inserted through the bundling member insertion holes 221).

The thus obtained wiring module 1 is mounted on the stacked device 90. Specifically, the positioning projections 92h, 92l of the stacked device 90 are inserted into the respective positioning holes 23h, 23l of the wiring module 1 (positioning member 20). Since the intervals between the respective positioning holes 23h, 23l and those between the respective positioning projections 92h, 92l are equal as described above, the positioning projections 92h, 92l are engaged with all the positioning holes 23h, 23l. In this way, the wiring module 1 is positioned and mounted at a predetermined position with respect to the stacked device 90.

When the positioning projections 92h, 92l are engaged with the positioning holes 23h, 23l, the respective connectors 12 of the wiring harness 10 fixed to the connector fixing portions 21 face the corresponding fitting portions 91 provided on the respective units 90a of the stacked device 90. Thus, by bringing the wiring module 1 and the stacked device 90 toward each other to bring the rear surface of the wiring module 1 and the front surface of the stacked device 90 into close contact, the respective connectors 12 are fitted into the corresponding fitting portions 91. In this way, the respective units 90a of the stacked device 90 are electrically connected to the respective wires 11 of the wiring harness 10. If ends of the respective wires 11 of the wiring harness 10 opposite to those on which the connectors 12 are mounted are electrically connected to a certain device, this certain device and the respective units 90a of the stacked device 90 are electrically connected via the wiring harness 10.

Next, a wiring module 2 according to a second embodiment is described, centering on points of difference from the wiring module 1 according to the first embodiment. The wiring module 2 according to the second embodiment includes a wiring harness 10 and a positioning member 20' as in the first embodiment.

As in the first embodiment, the wiring harness 10 includes a plurality of wires 11 (formed by covering one or more strands with a coating material) and connectors 12 mounted on ends of the respective wires 11. A wire restricting member 13 is fixed to each wire 11 at a position having a predetermined length from the end on which the connector 12 is provided (described in detail later). The wire restricting member 13 may be any member as long as it is a member projecting more radially outward than the wire 11 (coating material). As in the first embodiment, the connectors 12 are fittable into the fitting portions 91 provided on the respective units 90a of the stacked device 90 and all the connectors 12 fixed to the ends of the respective wires 11 are identically shaped.

The positioning member 20' is formed with wire restricting portions, wire accommodating passages 22, positioning holes 23h, 23l (corresponding to positioning portions in the present invention). Specifically, the positioning member 20' differs from that of the first embodiment in that the connector fixing portions 21 are not formed and the wire restricting portions are formed. Out of these components, the wire accommodating passages 22 (and bundling member insertion holes 221 formed on outer walls thereof) are configured similarly to the first embodiment.

Figure 3:
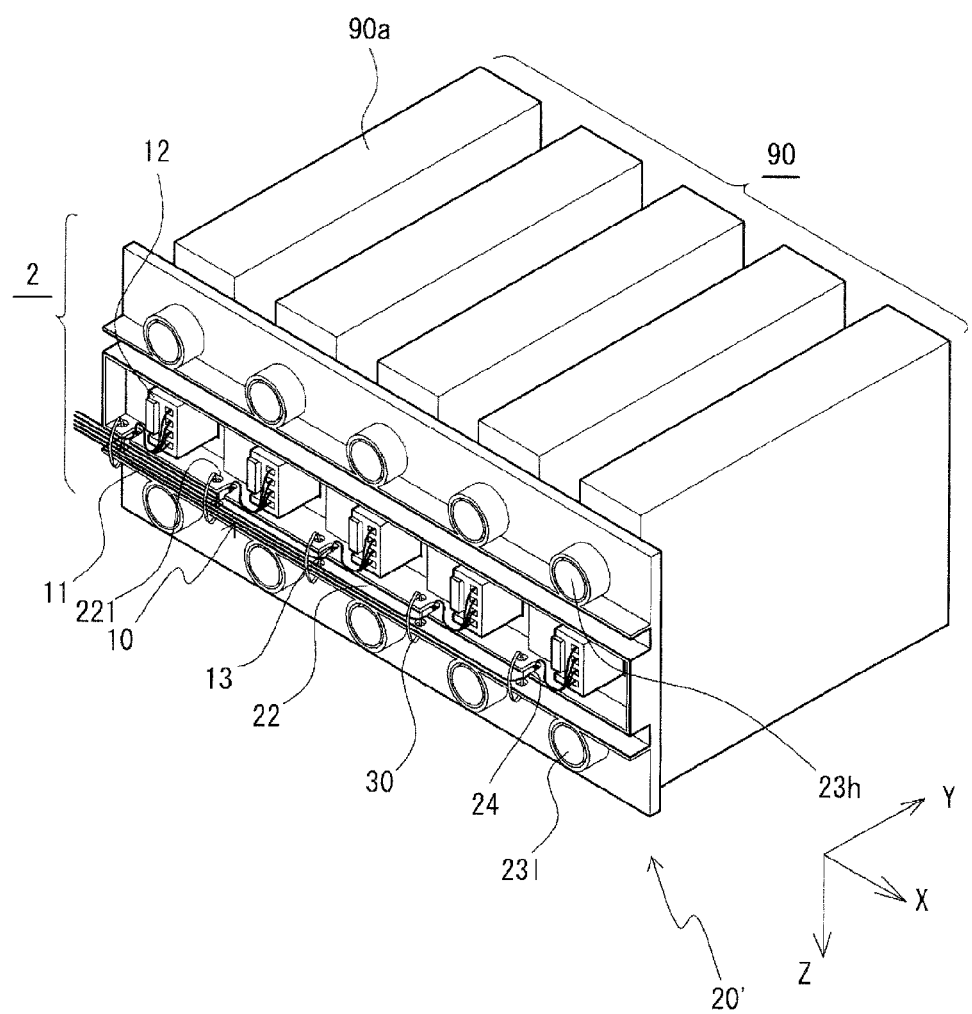
FIG. 3 is an external perspective view showing a state where the wiring module according to a second embodiment of the present invention is mounted on the stacked device.
Figure 4:
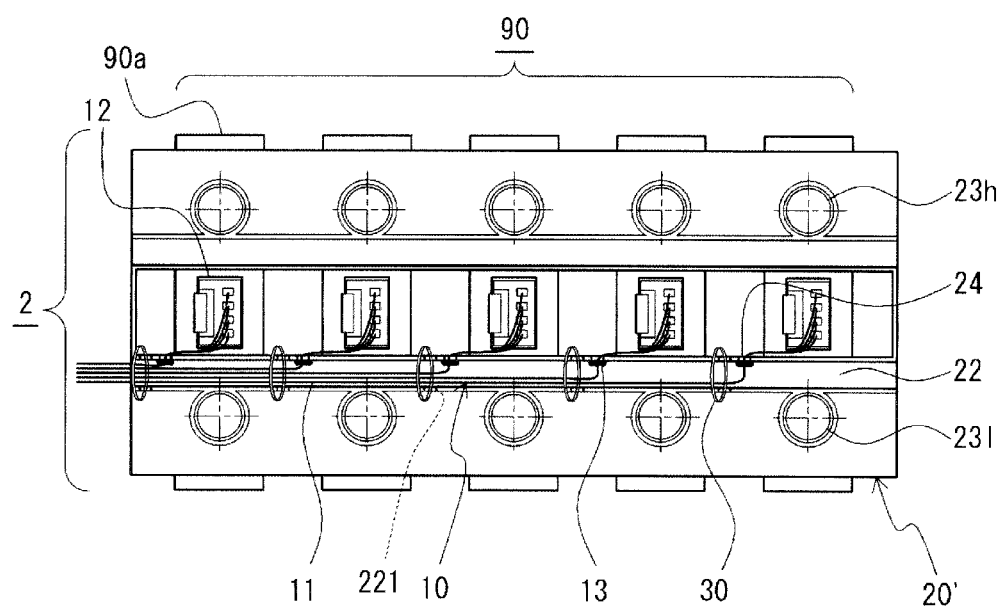
FIG. 4 is a plan view (view viewed in a Y direction) showing a state where the wiring module according to the second embodiment of the present invention is mounted on the stacked device.

The wire restricting portions in this embodiment are slits 24 (narrow cuts) as shown in FIGS. 3 and 4. The width of the slits 24 is larger than the diameter of the wires 11 (coating materials) and smaller than the diameter of the wire restricting members 13 provided on the wires 11 (width not allowing the passage of the wire restricting members 13). Each wire 11 constituting the wiring harness 10 is caught by and engaged with a lower side of the slit 24. Thus, the end of the wire 11 fixed to the connector 12 can be freely guided above the slit 24. That is, the length of the freely guidable part of each wire 11 is a length from the end on which the connector 12 is provided to the position of the wire restricting member 13 (strictly speaking, a length obtained by subtracting the thickness of a part of the positioning member 20' where the slit 24 is formed from the former length).

The lengths of the freely guidable parts of the above wires 11 (in other words, the positions of the wire restricting members 13) are set at such lengths that the respective connectors 12 cannot be fitted into the fitting portions 91 other than the corresponding ones. For example, the connector 12 located on the leftmost side in FIG. 3 cannot be fitted into the fitting portions 91 other than the corresponding one 91 located on the leftmost side. That is, the freely guidable part has such a length that a certain connector 12 reaches the corresponding fitting portion 91, but cannot reach the other fitting portions 91. In other words, since the base end of the freely guidable part of each wire 11 coincides with the position of the positioning member 20' where the back end of the slit 24 is formed, the slit 24 is formed at a position meeting such a condition.

As just described, in this embodiment, by engaging the wire restricting member 13 with the slit 24, the part of the wire 11 having a predetermined length from the tip (end on which the connector 12 is provided) is made freely guidable and the length of this freely guidable part is so set that the connector 12 cannot be fitted into the fitting portions 91 other than the corresponding one 91. Note that the above configuration for specifying the guidable length using the lit 24 and the wire restricting member 13 that cannot pass through the slit 24 is an example. Any configuration may be adopted as long as the wire 11 is restricted by the positioning member 20' at a position at a predetermined distance from the tip (connector 12).

The wiring modules 1, 2 according to the embodiments (first and second embodiments) of the present invention have been described above. According to these wiring modules 1, 2, the following functions and effects are achieved.

According to the wiring modules 1, 2 according to the above first and second embodiment, each connector 12 of the wiring harness 10 can be easily and reliably fitted into the corresponding fitting portion 91 of the stacked device 90. Specifically, if the wiring module 1 according to the first embodiment is used, each connector 12 fixed to the connector fixing portion 21 of the positioning member 20 faces the corresponding fitting portion 91 when the positioning member 20 is positioned at the predetermined position with respect to the stacked device 90. Thus, each connector 12 is not fitted into the fitting portions 91 other than the corresponding one 91. If the wiring module 2 according to the second embodiment is used, the length of the freely guidable part of each wire 11 of the wiring harness 10 is so set that the connector 12 cannot be fitted into the fitting portions 91 other than the corresponding one 91. Thus, each connector 12 is not fitted into the fitting portions 91 other than the corresponding one 91.

Further, the wiring harness 10 is accommodated in the channel-like wire accommodating passage 22 formed on the positioning member 20 (20'). That is, the positioning member 20 (20') fulfills not only a positioning function of positioning the wiring harness 10 at the predetermined position with respect to the stacked device 90, but also a wire protecting function.

Since the bundling member insertion holes 221 are formed on the outer walls of the wire accommodating passage 22, the wires 11 accommodated into the wire accommodating passage 22 can be easily bundled by the bundling members 30.

Further, each unit 90a constituting the stacked device 90 is provided with two positioning projections 92h, 92l (positioned portions) and the positioning member 20 (20') is provided with the positioning holes 23h, 23l (positioning portions) to be engaged with both of these two positioning projections 92h, 92l. That is, since the positioning member 20 (20') is positioned with respect to the respective units 90a, the wiring harness 10 (connectors 12) is unlikely to be displaced from the fitting portions 91. If the positioning member 20 (20') is mounted based on only two or more positioning projections extending over a plurality of units 90a, the mounted position of the positioning member 20 (20') may be displaced due to a stacking error (assembling error) of the respective units 90a in the stacked device 90. However, according to these embodiments, there is no possibility of such a displacement since the positioning member 20 (20') is positioned by two or more positioning projections 92h, 92l provided on each unit 90a.

Although the embodiments of the present invention have been described in detail above, the present invention is not limited to the above embodiments and can be variously modified without departing from the gist of the present invention.

The invention claimed is:

1. A wiring module to be mounted on a stacked device formed by stacking a plurality of units in a stacking direction, each of the units including first and second positioning projections spaced apart in a direction transverse to the stacking direction and an identically shaped connector fitting portion formed on each of the plurality of units between the first and second positioning portions, comprising:
    a wiring harness including a plurality of wires and a plurality of connectors fixed to ends of the respective wires; and
    a positioning member having opposite first and second surfaces and capable of being positioned at a predetermined position with respect to the stacked device and including a plurality of first positioning holes extending between the first and second surfaces and spaced apart in the stacking direction and a plurality of second positioning holes extending between the first and second surfaces and spaced apart in the stacking direction, each of the plurality of first positioning holes aligned with one of the plurality of second positioning holes and spaced therefrom in the direction transverse to the stacking direction;
    a plurality of connector fixing portions extending between the first and second surfaces of the positioning member and spaced apart in the stacking direction, each of the connector fixing portions positioned between the corresponding first and second positioning holes and aligned therewith in the direction transverse to the stacking direction;
    at least one wire accommodating passage formed on the positioning member and extending in the stacking direction between one of the plurality of first positioning holes and the plurality of second positioning holes and the plurality of connector fixing portions and configured for accommodating the plurality of wires of the wiring harness;
    a plurality of first bundling member insertion holes formed in a wall of the at least one wire accommodating passage at positions corresponding to each of the plurality of connector fixing portions, and a plurality of second bundling member insertion holes formed in each of the plurality of connector fixing portions at positions corresponding to each of the plurality of first bundling member insertion holes; and
    a plurality of bundling members bundling the plurality of wires and inserted through corresponding pairs of the plurality of first bundling member insertion holes and the plurality of second bundling member insertion holes, wherein
    each of the plurality of connectors of the wiring harness is connected to a corresponding one of the plurality of connector fixing portions in a state where the positioning member is positioned at the predetermined position with respect to the stacked device, and
    the positioning member is fitted on the stacking device with each of the plurality of first positioning holes and each of the plurality of second positioning holes being fit to the first and second positioning projections and each of the plurality of connectors fit into the connector fitting portion of one of the plurality of units.

2. The wiring module of claim 1, wherein:
    the wiring harness is so fixed to the positioning member that parts of each of the plurality of wires having predetermined lengths from each of the plurality of connectors are freely guidable; and the length of the freely guidable part of each of the plurality of wires is so set that each of the plurality of connectors is not fittable into each of the plurality of fitting portions other than the corresponding ones out of the plurality of fitting portions in a state where the positioning member is positioned at the predetermined position with respect to the stacked device.

3. The wiring module according to claim 1, wherein the positioning member includes positioning portions corresponding to two or more positioned portions provided on each unit constituting the stacked device.

4. The wiring module according to claim 1, wherein the at least one wire accommodating passage comprises a first wire accommodating passage extending in the stacking direction between the plurality of first positioning holes and the plurality of connector fixing portions and a second wire accommodating passage extending in the stacking direction between the plurality of second positioning holes and the plurality of connector fixing portions.

5. A wiring module, comprising:
a wiring harness including a plurality of wires and a plurality of connectors fixed to ends of the respective wires;
a positioning member having opposite first and second surfaces, a plurality of first positioning holes extending between the first and second surfaces and spaced apart in lateral direction and a plurality of second positioning holes extending between the first and second surfaces and spaced apart in the lateral direction, each of the plurality of first positioning holes aligned with one of the plurality of second positioning holes and spaced therefrom in the direction transverse to the lateral direction, and a plurality of connector fixing portions extending between the first and second surfaces and spaced apart in the lateral direction, each of the connector fixing portions positioned between the corresponding first and second positioning holes and aligned therewith in the direction transverse to the lateral direction;
at least one wire accommodating passage formed on the positioning member and extending in the lateral direction between one of the plurality of first positioning holes and the plurality of second positioning holes and the plurality of connector fixing portions and configured for accommodating the plurality of wires of the wiring harness;
a plurality of first bundling member insertion holes formed in a wall of the at least one wire accommodating passage at positions corresponding to each of the plurality of connector fixing portions, and a plurality of second bundling member insertion holes formed in each of the plurality of connector fixing portions at positions corresponding to each of the plurality of first bundling member insertion holes;
a plurality of bundling members bundling the plurality of wires and inserted through corresponding pairs of the plurality of first bundling member insertion holes and the plurality of second bundling member insertion holes; and
a stacked device formed by stacking a plurality of units in the lateral direction, each of the units including first and second positioning projections spaced apart in the direction transverse to the lateral direction and a connector fitting portion between the first and second positioning projections, wherein
the positioning member is held at a predetermined position with respect to the stacking device and each of the plurality of connectors is fit into a corresponding one of the plurality of connector fixing portions, and
the positioning member is fixed to the stacking device so that the plurality of first positioning holes and the plurality of second positioning holes engage the first and second positioning projections and each of the plurality of connectors are fit into the connector fitting portions of the plurality of units.

6. The wiring module of claim 5, wherein:
the wiring harness is so fixed to the positioning member that parts of each of the plurality of wires having predetermined lengths from each of the plurality of connectors are freely guidable; and
the length of the freely guidable part of each of the plurality of wires is so set that each of the plurality of connectors is not fittable into each of the plurality of fitting portions other than the corresponding ones out of the plurality of fitting portions in a state where the positioning member is positioned at the predetermined position with respect to the stacked device.

7. The wiring module according to claim 5, wherein the positioning member includes positioning portions corresponding to two or more positioned portions provided on each unit constituting the stacked device.

\* \* \* \* \*